(12) United States Patent
Ancis et al.

(10) Patent No.: US 8,884,662 B2
(45) Date of Patent: Nov. 11, 2014

(54) METHOD FOR CHARGE SHARING/REUSE OF ELECTRONIC CIRCUITS

(71) Applicant: Dialog Semiconductor B.V., 's-Hertogenbosch (NL)

(72) Inventors: Michele Ancis, Sint-Michielsgestel (NL); Rahul Todi, Eindhoven (NL)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 23 days.

(21) Appl. No.: 13/853,238

(22) Filed: Mar. 29, 2013

(65) Prior Publication Data

US 2014/0266327 A1    Sep. 18, 2014

(30) Foreign Application Priority Data

Mar. 15, 2013 (EP) ..................................... 13001323

(51) Int. Cl.
    *H03B 1/00*     (2006.01)
    *H03K 3/00*     (2006.01)
    *H03K 3/012*    (2006.01)

(52) U.S. Cl.
    CPC ..................................... *H03K 3/012* (2013.01)
    USPC .......................................... 327/112; 327/108

(58) Field of Classification Search
    USPC .................................................. 327/108–112
    See application file for complete search history.

(56) References Cited

U.S. PATENT DOCUMENTS

| | | | |
|---|---|---|---|
| 5,859,548 A | 1/1999 | Kong | |
| 5,867,040 A | 2/1999 | Fuse et al. | |
| 6,009,021 A | 12/1999 | Kioi | |
| 6,559,681 B1 | 5/2003 | Wu et al. | |
| 7,463,073 B2 * | 12/2008 | Chung et al. | 327/112 |
| 8,054,111 B2 | 11/2011 | Osame et al. | |
| 2002/0140458 A1 | 10/2002 | Sato et al. | |

OTHER PUBLICATIONS

European Search Report 13001323.8-1810, Mailed: Jul. 10, 2013, Dialog Semiconductor B.V.
"Half-Swing Clocking Scheme for 75% Power Saving in Clocking Circuitry," by Hirotsugu Kojima et al., 1994 Symposium on VLSI Circuits Digest of Technical Papers, Jun. 9, 1994, pp. 23-24.
Co-pending U.S. Appl. No. 13/853,305, filed Mar. 29, 2013 "Method for Reducing Overdrive Need in MOS Switching and Logic Circuit," Michele Ancis et al., 22 pgs.

* cited by examiner

*Primary Examiner* — Hai L Nguyen
(74) *Attorney, Agent, or Firm* — Saile Ackerman LLC; Stephen B. Ackerman

(57) ABSTRACT

The present disclosure discloses methods and circuits to reduce power consumption of switching circuits comprising two or more units by applying charge sharing/reuse of capacitive loads between the units. The units are stacked in a way that, if an output potential of a unit is to be lowered and an output potential of a neighboring unit is to be lifted, a charge of the unit to be lowered is reused by transferring it to the unit to be lifted depending on input signals of the units. In case of input signals having an arbitrary relationship a storage unit is placed at a junction of two neighboring units to store the charge temporarily until a neighboring unit is to be lifted.

20 Claims, 6 Drawing Sheets

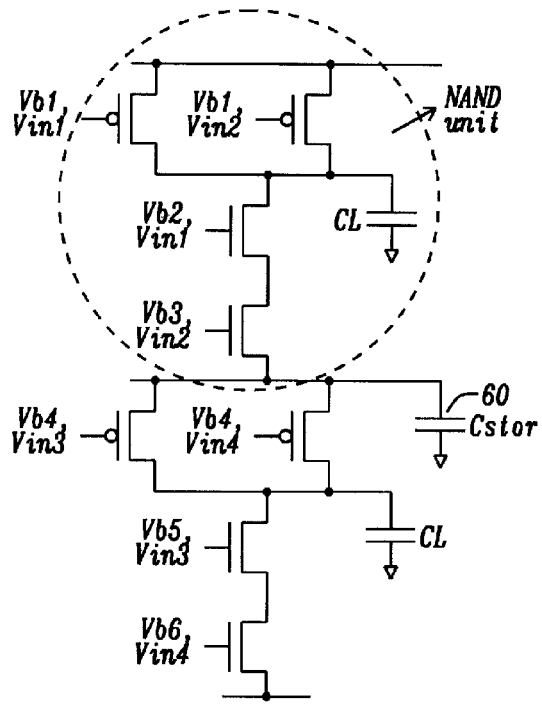
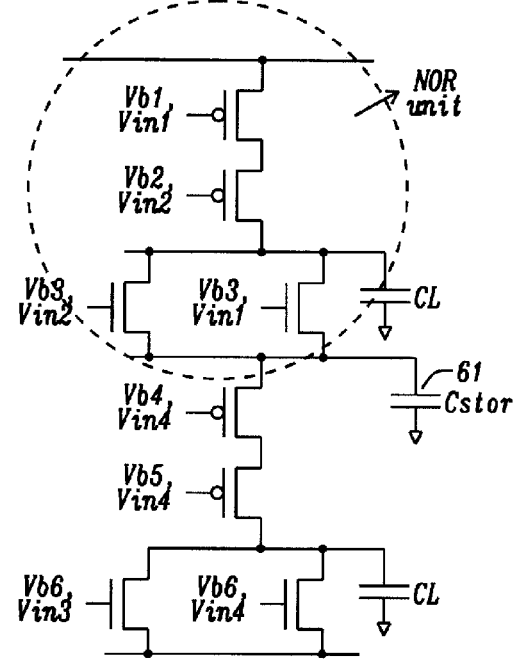
*FIG. 6a*     *FIG. 6b*
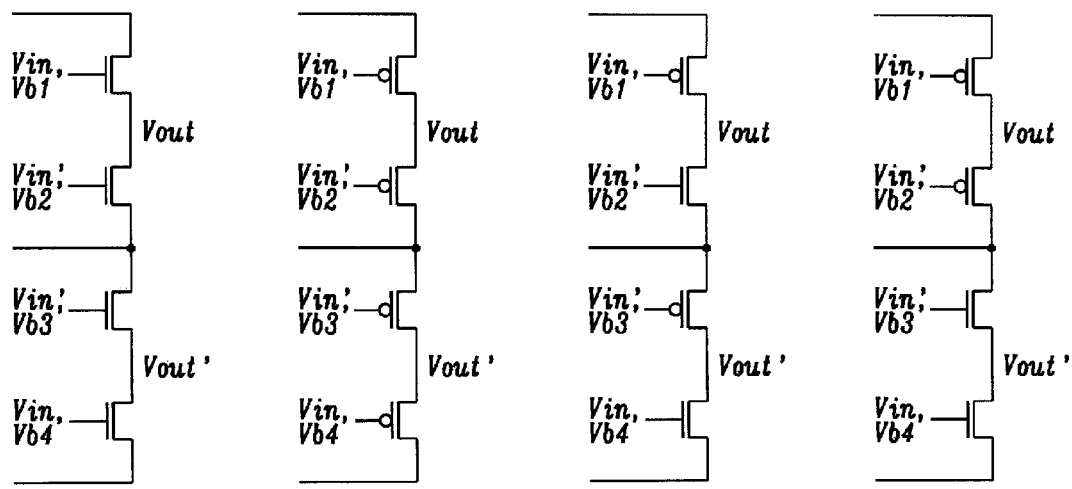
*FIG. 7*

METHOD FOR CHARGE SHARING/REUSE OF ELECTRONIC CIRCUITS

RELATED APPLICATION

This application is related to the following Ser. No. 13/853,305, filing date Mar. 29, 2013 and is assigned to the same assignee. The content of this application is hereby incorporated by reference in their entirety.

TECHNICAL FIELD

The present document relates to electronic circuits. In particular, the present document relates to electronic circuits for signals whose information content lies in their frequency and whose characteristics have to be transferred to predominantly capacitive loads

BACKGROUND

There is a plethora of logic circuit families, CMOS logic families being the most prominent ones which are used to design digital circuitry (sequential/combinational) or to realize a digital buffer in the form of chain of inverters. The drawback of these families is the fixed value of the power gain, dictated by load and frequency. This is because in such arrangements, the voltage swing both at the input as well as at the output is fixed, non-scalable and equal to the full supply headroom. This is explained further by taking the simplest circuit in the digital world—the CMOS inverter which is also the basic building block of a digital buffer (attractive solution at lower technology nodes, because of speed and lower device parasitics).

A chain of inverters is usually used to drive large capacitive load (interconnections/logic) for the propagation of digital signals. A unit cell i.e. the CMOS inverter is shown in FIG. 1 prior art comprising PMOS transistor 10, NMOS transistor 11, and capacitive load $C_L$.

Dynamic power in the form of charging and discharging of the load capacitor, $C_L$ dominates the overall power consumption (See Equation 1).

$$P_{dyn} = C_L \times V^2_{swing} \times f_{op} \quad (1).$$

The voltage at the output $V_{swing}$ swings from 0 to VDD, $C_L$ is a capacitive load and $f_{op}$ is the frequency of operation.

According to Equation (1), for a given load the dynamic power is a fixed number and cannot be optimized.

SUMMARY

A principal object of the present disclosure is to achieve a degree of freedom in the determination of power gain in switching circuits.

A further principal object of the disclosure is to reduce the power consumption of switching circuits which is primarily dominated by the dynamic power given by Equation (1), by applying charge sharing/reuse for capacitive loads.

A further object of the disclosure is to realize a full family of logic circuits based on supply reduction and AC coupling concepts.

A further object of the disclosure is to realize amplifiers/attenuators, both digitally and analogically controlled, based on progression/modulation in the supply range from stage to stage.

In accordance with the objects of this disclosure a method to reduce the power consumption of switching circuits by applying charge sharing/reuse for capacitive loads has been achieved. The method disclosed comprises the steps of: (1) providing a switching or logic circuitry comprising two or more units, wherein each unit has an output capacitive means, and (2) stacking the units of the circuitry in a way that, if an output potential of an unit is to be lowered, the charge flowing out of the output node of this unit is either used right away to lift the output node of a lower unit, or flows into a storage element for subsequent use, depending on input signals of the units . . . .

In accordance with the objects of this disclosure a switching circuit configured to charge sharing/reuse of capacitive loads configured to lower signal range has been achieved. The switching circuit disclosed firstly comprises: two or more switching circuit units stacked upon each other wherein each unit comprises: two ports for input signals wherein each port is associated to a transistor, two transistors, wherein each transistor has a gate connected to the associated port, and an output capacitive means to store a charge depending upon a level of the input signals, wherein the units are stacked in a way that, if an output potential of an unit is to be lowered, the charge flowing out of the output node is either used right away to lift the output node of a lower unit, or flows into a storage element for subsequent use, depending on input signals of the units.

BRIEF DESCRIPTION OF THE FIGURES

The invention is explained below in an exemplary manner with reference to the accompanying drawings, wherein FIG. 1 prior art shows a standard CMOS Inverter.

FIG. 6a shows a stacked NAND unit.

FIG. 6b shows a stacked NOR unit.

FIG. 7 illustrates for example possible 2-stacked inverter arrangements.

DETAILED DESCRIPTION

Methods and circuits to reduce power consumption of switching circuits by applying sharing/reuse for capacitive loads are disclosed.

A method of charge reuse disclosed achieves n-fold power saving, where n is the number of elements able to share the charge. The stacked unit cells or units are in the form as disclosed in the Ser. No. 13/853,305, filing date Mar. 29, 2013. Key elements of the present disclosure briefly highlighted in the points below:

1. Stacking of Networks

Figure 2A:
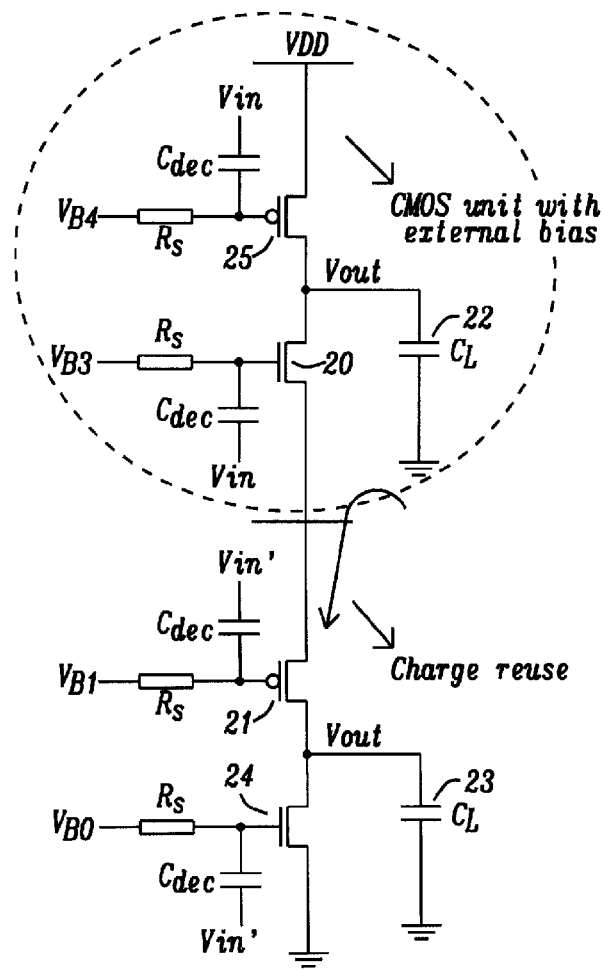
FIG. 2a depicts stacked units with differential signal.

The stacking of networks is performed of the form as disclosed in the Ser. No. 13/853,305, filing date Mar. 29, 2013. The concept of stacking is illustrated in FIG. 2a for the simplest case of a two-stacked configuration of CMOS inverters driven by differential input signals. The nature of the inputs is such that, the NMOS 20 of the top unit and the PMOS 21 of the bottom one are conducting at the same time, thus allowing the charge stored in the top load capacitor or capacitive means $C_L$ 22 to flow through them and be stored in the bottom load capacitor or capacitive means $C_L$ 23. This way, the charge used to lift the potential of the upper load 22 is recycled to lift the potential of the lower load 23, while the upper one is discharged.

Comparing the power needed to drive two loads of $C_L$ 22 and 23 each, the two-stacked topology requires $P_{dyn-bias}/2$ where $P_{dyn-bias}$ is the total power consumed by the two non-stacked units to drive the loads individually. The power can be further reduced by stacking more units and reutilizing the charge again and again. Generalizing, to drive $N \times C_L$ capacitive loads, $P_{stacked} = P_{dyn-bias}/N$ where N is the number of units stacked and $P_{dyn-bias}$ is the power needed to drive $N \times C_L$ capacitive loads with N non stacked units. The number of units being stacked depends on the supply voltage and The PMOS/NMOS combinations, which is described in the next section.

Furthermore it should be noted that a stack of a number of "vertically" stacked units, as shown e.g. in FIGS. 2a, 2b, 3 and 4, may be connected to one or more next stages, each stage comprising also a number of "vertically" stacked units. The number of units in each stage may be equal, higher or lower than the number of units of the first stage.

2. Adding a Storage Element Between Stacked Units

Figure 2B:
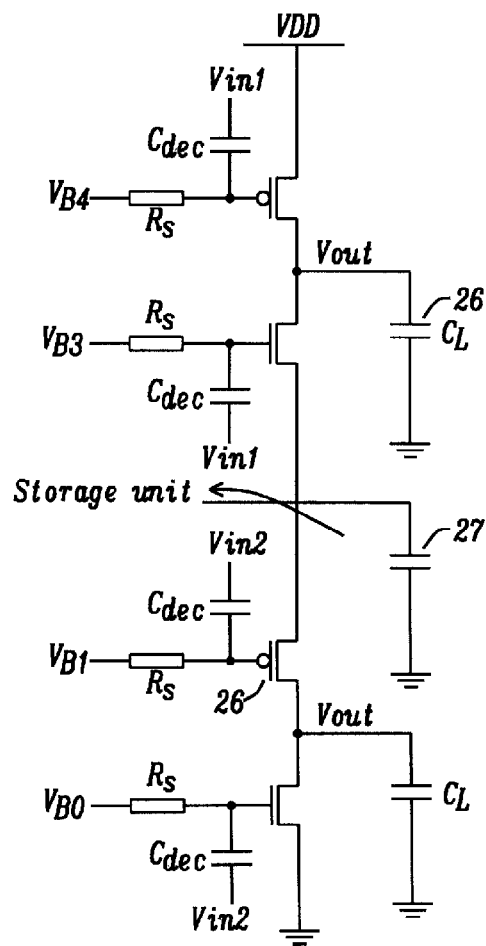
FIG. 2b depicts stacked unit with uncorrelated input and a storage unit

The concept of stacked units described above may be extended to signals in an arbitrary relationship (not necessarily differential or in quadrature) by placing a storage unit, e.g. a capacitor, at the junction of the two units as shown in FIG. 2b. The charge used for the load flows through the upper unit to charge the storage element 27, which in turn delivers it through the units below when the other signal $V_{in2}$ switches the PMOS 26 on.

Figure 3:
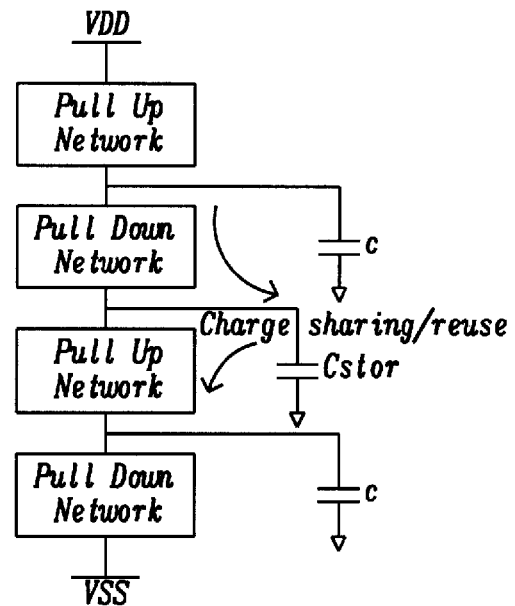
FIG. 3 illustrates a generalized overview of charge sharing/reuse

The above concept is not limited to inverters as drivers. As pointed out above items, the units can assume any format as disclosed in the Ser. No. 13/853,305, filing date Mar. 29, 2013. FIG. 3 shows a generalized overview of charge sharing/reuse with pull-up and pull-down networks. A few examples with NOR/NAND is given in the next section.

As disclosed in the Ser. No. 13/853,305, filing date Mar. 29, 2013, the signal range of the units may be lowered below supply range by adding at least one generic device network to each unit, each generic device network comprising a voltage source. One generic device network may be connected to supply voltage in order to generate a positive reference voltage, which is lower than supply voltage and another generic device network may be connected to ground to generate a lower reference voltage that is higher than ground voltage. It should be noted that the voltages generated by voltage sources of the generic device networks are constant and independent of the currents flowing through them. Furthermore, as described in the Ser. No. 13/853,305, filing date Mar. 29, 2013, the signal range is decoupled from biasing voltages by providing a DC biasing network comprising biasing voltage sources providing biasing voltages as required and corresponding resistors providing impedances required and AC signal coupling of active devices of the circuit is provided by a capacitive network. The biasing of the active devices may also be used to achieve voltage swings below threshold voltages.

As also described in the Ser. No. 13/853,305, filing date Mar. 29, 2013, Pull-up networks (PU) and Pull-down (PD) networks are deployed. A Pull-Up network (PU) network is a combination of devices able to tie the output of a stage to an upper reference voltage and accordingly a Pull-Down network (PD) network is just a combination of devices able to tie the output of the stage to a lower reference voltage. Pull-Up really means "pull output to supply" and Pull-Down really means "pull output to ground". However, in the circuits of the present disclosure "supply" and "ground" are not those of the system, but especially created ones using the voltage sources of the generic devices network generating the upper reference voltage and the lower reference voltage.

In regard of stacking the case of stacking, the concept as disclosed in the Ser. No. 13/853,305, filing date Mar. 29, 2013 has been extended. With reference to FIG. 2a, there is no generic device network attached to ground and the lower reference voltage is therefore ground voltage and the bottom CMOS inverter 21, 24 has ground voltage as its lower reference voltage and the upper reference voltage of the bottom CMOS inverter 21, 24 is a "virtual voltage", set at half the $V_{DD}$ by the symmetry of the circuit and its operation. Dually, for the top CMOS inverter 20, 25, the supply voltage VDD is the upper reference voltage (no generic device network is deployed in this case) and the lower reference voltage is a virtual voltage set to $V_{DD}/2$. The stacked units are actually two objects, as disclosed in the patent application Ser. No. 13/853,305, filing date Mar. 29, 2013, merged. The virtual voltage amounts to generally, if N objects are stacked between a supply voltage and "ground, the available supply voltage divided by N.

The operation principles of the key items described above are outlined here accompanied by some examples. As disclosed in the Ser. No. 13/853,305, filing date Mar. 29, 2013, flexibility over the output swing of the switching unit can be achieved by applying an external bias. This enables stacking units on top of another.

Current Reuse/Stacking

Figure 1:
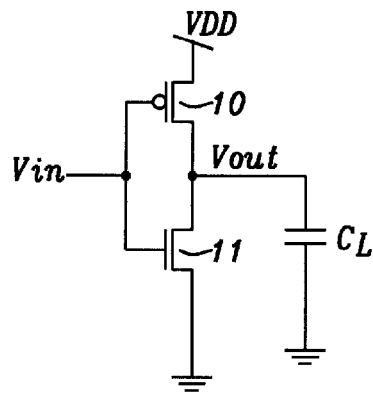
Figure 4:
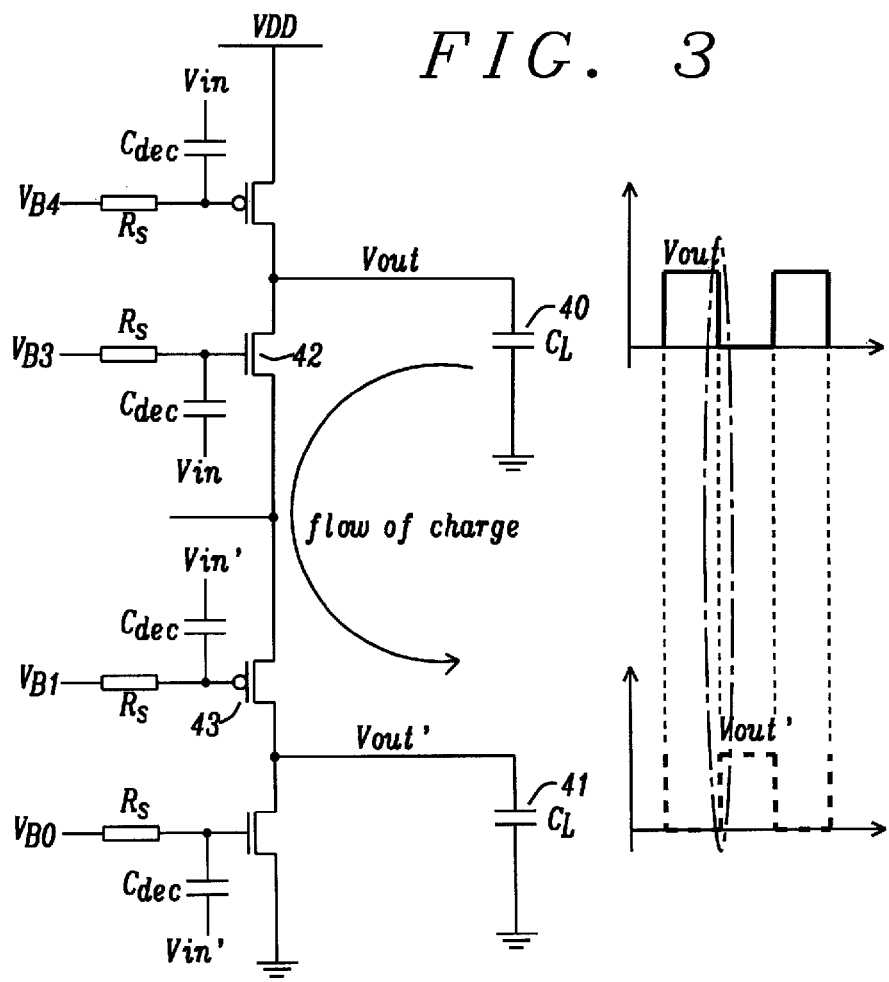
FIG. 4 shows a diagram of stacked inverters.

The key element of the disclosure is best explained by referring to the simplest circuit possible, a CMOS inverter. With reference to the standard embodiment of this circuit shown in FIG. 1, it has to be noted that while the NMOS transistor 11 is conducting, all the charge from the load capacitance $C_L$ flows into the ground. Instead, given the possibility to drive such circuits with a reduced signal swing, as disclosed in the patent application Ser. No. 13/853,305, filing date Mar. 29, 2013, and with the available differential signal, two inverters, as illustrated in FIG. 4, may be stacked to reuse the charge stored in the upper load 40 a second time, to charge the bottom load 41 through the upper unit NMOS 42 and bottom unit.

When the NMOS transistor 42 of the upper unit is conducting, the PMOS transistor 43 of the bottom unit is also conducting (as the input signals are complimentary), thus creating an electrical path for the charge to flow into the bottom load 41. Hence the same power is required to drive twice the load in the case of a two-stacked configuration.

Figure 5:
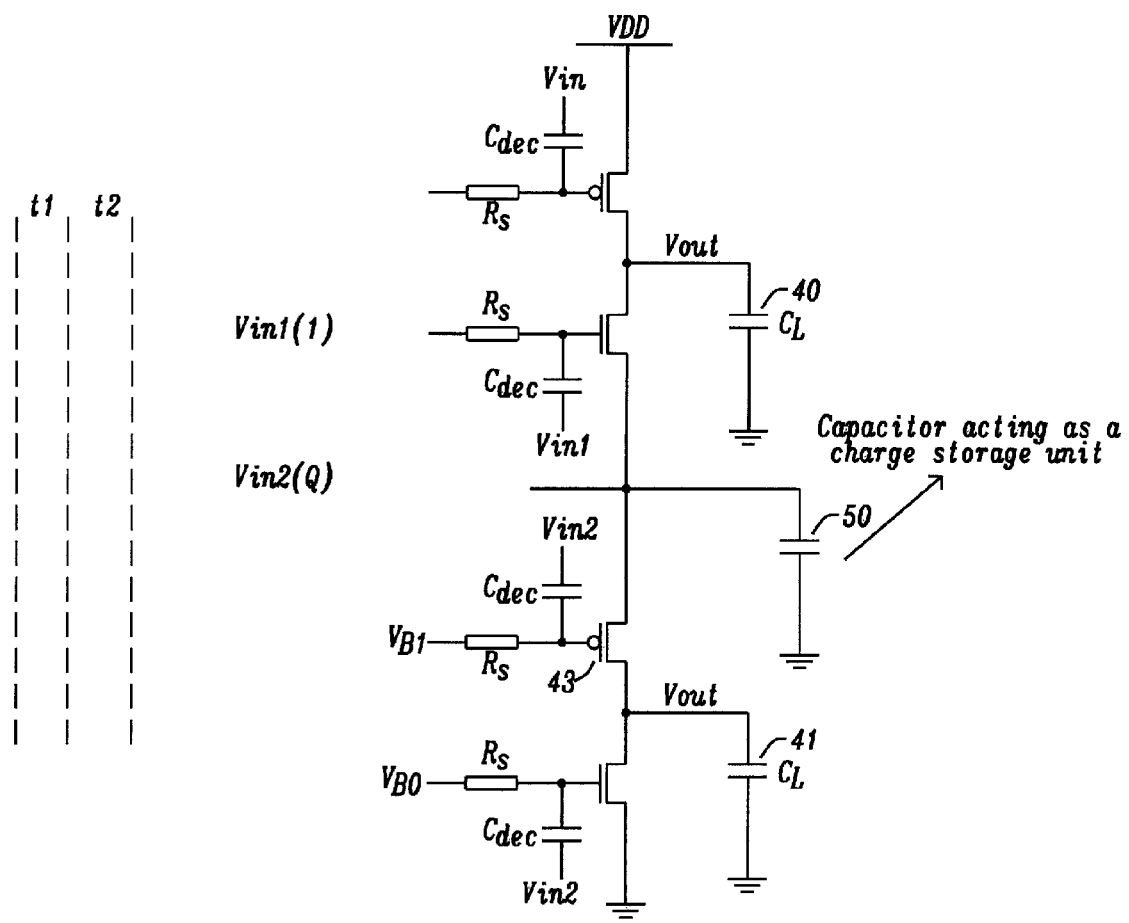
FIG. 5 illustrates stacked units for I and Q signals with a storage unit.

As stated before, the concept can be extended beyond differential signals by using a storage unit. FIG. 5 illustrates stacked units for I and Q signals with a storage unit. The same 2 stacked CMOS inverters with a storage unit are analyzed with I and Q signals; I and Q are the In-phase and Quadrature components of a signal, i.e. another very frequent occurring signal relationship.

For the time interval t1, the charge from the load 40 of the top unit is stored in the storage capacitor 50 as the PMOS transistor 43 of the bottom unit is still not conducting. During the time interval t2, the PMOS 43 becomes conductive and allows the charge stored in the storage capacitor 50 between the two units to flow to the bottom load 41. The same will hold true for two signals with any phase relation as long as the storage unit 50 is there.

The concepts outlined above were described with inverters as example. They can be extended to any general pull-up and pull-down network combination as explained and defined in as disclosed in the Ser. No. 13/853,305, filing date Mar. 29, 2013, As an example, FIGS. 6a+b demonstrate two universal gates, NAND and NOR, wherein FIG. 6a shows a NAND gate and FIG. 6b shows a NOR gate.

It can be seen that the NAND/NOR gates are arranged in a CMOS fashion with the external bias to boost its overdrive. With the help of the storage unit 60 and 61 at the junctions, these circuits enable charge reuse, thus saving power.

The concept of charge sharing is not limited to CMOS and stacking of units up to 2 levels. Any other semiconductor technology having three terminal devices in which a voltage between a controlling terminal and a reference allows/block charge flow from the other terminal to the reference terminal could be applied with the present disclosure.

The present disclosure can be extended beyond CMOS and stacking of 2 levels, based on the supply and transistor arrangement. The power may be reduced N times by stacking N units, as the charge is reutilized N times. The higher the supply and lower the threshold voltage Vth of a transistor (determined by the technology node), the more units can be stacked. The latter, that is the arrangement of the transistors, is explained by again taking the simple circuit of an inverter and can be extended to other switching circuits in a similar fashion. In FIG. 4, the inverters were arranged in a CMOS fashion. There are other alternatives for stacking two units, having the same functionality. This is demonstrated in FIG. 7 illustrating for example possible 2-stacked inverter arrangements. For two-stacked inverter arrangements, four possible combinations are possible.

Figures 8A, 8B:
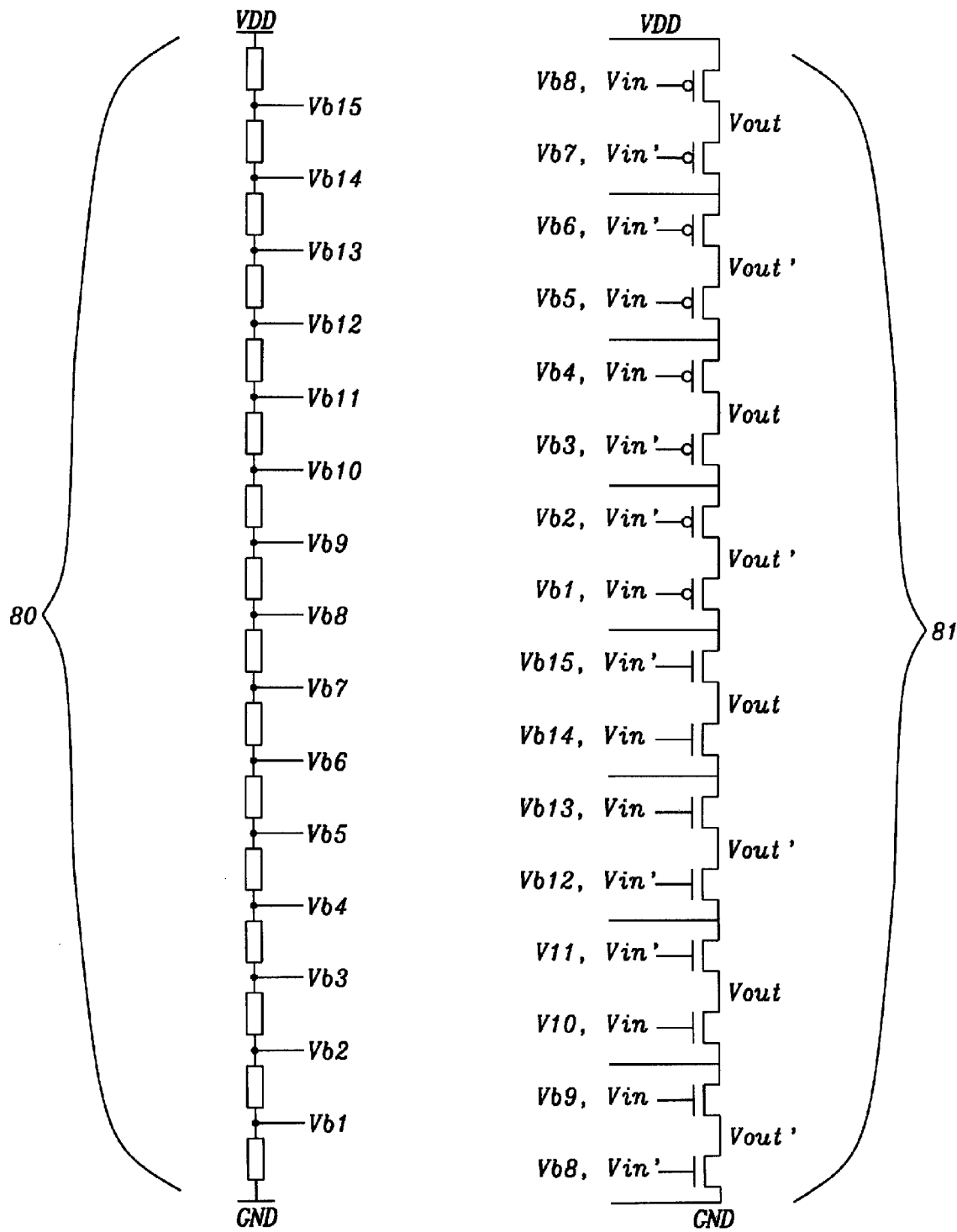
FIG. 8a illustrates a resistor chain comprising of 16 resistors generating the respective bias conditions which are applied to transistors in a stacked configuration of FIG. 8b.
FIG. 8b depicts an 8 stacked standard $V_{th}$ digital buffer in a 55 nm tech node, for 1.2V power supply

For example, in a 55 nm technology node a maximum of 8 drivers can be stacked today given VDD is 1.2 V, a peak differential swing of 150 mV at the output, threshold voltage $V_{th}$ of approximate 400 mV and an input swing of 400 mV. It is shown in FIG. 8b depicting for example an 8 stacked standard $V_{th}$ digital buffer in a 55 nm tech node for 1.2V power supply FIG. 8a illustrates a resistor chain 80 comprising of 16 resistors generating the respective bias conditions which are applied to the transistors in the stacked configuration 81 of FIG. 8b. Each pair of transistor swings e.g. to 150 mV and 8 of these pairs are stacked inside the given supply of 1.2 V. The drive strength of the NMOS transistors and the PMOS transistors should be the same by design and it should adhere to the given delay and slew rate requirements. The given topology consumes a mere current of 50 uA and can drive 8 times 100 femtoFarads (fF) for a voltage swing of 150 mV peak differential. The results were verified by cadence simulations using a 55 nm PDK. It is extremely low power and hence, it comes out as a very attractive and feasible situation to drive high loads. A two stacked unit was implemented as part of a shuttle run and the measurement results corresponded very well to the simulations. It is obvious that all the numbers of stacked buffers, resistors, and transistors and the values of voltages, swings, supply voltages, size of technology node, etc., outlined above are non-limiting examples of the disclosure.

Figure 9:
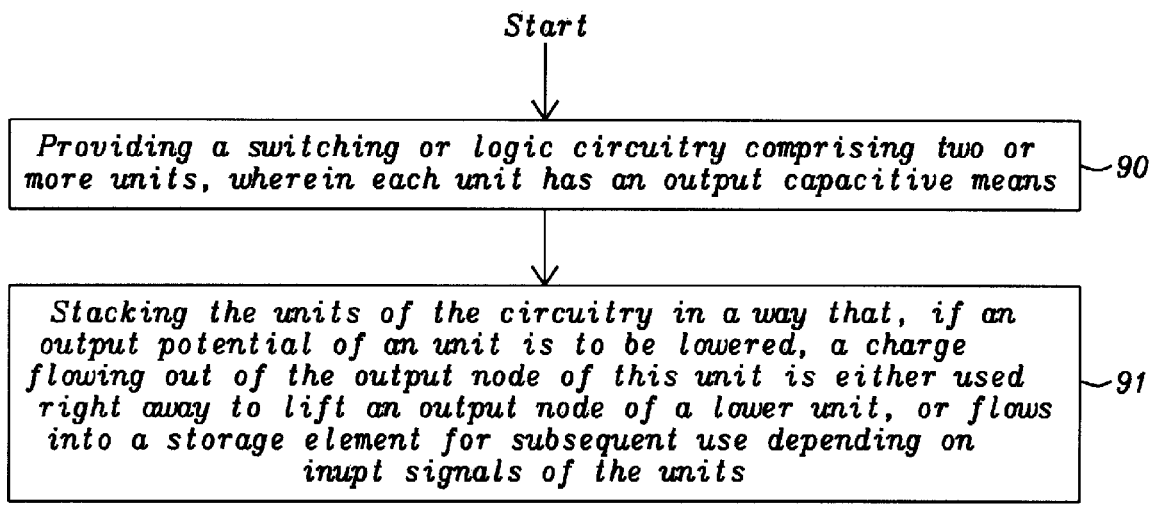
FIG. 9 shows a flowchart of a method to reduce the power consumption of switching circuits by applying charge sharing/reuse for capacitive loads.

FIG. 9 shows a flowchart of a method to reduce the power consumption of switching circuits by applying charge sharing/reuse of capacitive loads.

A first step 90 depicts a provision of a switching or logic circuitry comprising two or more units, wherein each unit has an output capacitive means. The next step 91 shows stacking the units of the circuitry in a way that, if an output potential of an unit is to be lowered the charge flowing out of the output node of this unit is either used right away to lift the output node of a lower unit, or flows into a storage element for subsequent use, depending on input signals of the units.

It should be noted that, as disclosed in the Ser. No. 13/853, 305, filing date Mar. 29, 2013, the switching circuits described in the present disclosure may be a base of a full family of logic circuits. This family may include combinational and sequential, i.e. including memory elements.

While the invention has been particularly shown and described with reference to the preferred embodiments thereof, it will be understood by those skilled in the art that various changes in form and details may be made without departing from the spirit and scope of the invention.

What is claimed is:

1. A method to reduce the power consumption of switching circuits by applying charge sharing/reuse on capacitive loads, the method comprising the steps of:
   (1) providing a switching or logic circuitry comprising two or more units, wherein each unit has an output capacitive means; and
   (2) stacking the units of the circuitry in a way that, if an output potential of an unit is to be lowered and an output potential of a neighboring unit is to be lifted, a charge of the unit to be lowered the charge flowing out of the output node of this unit is either used right away to lift the output node of a lower unit, or flows into a storage element for subsequent use, depending on input signals of the units.

2. The method of claim 1, wherein the logic circuitry is a CMOS circuitry.

3. The method of claim 1, wherein the input signals are differential signals.

4. The method of claim 1, wherein signal range of the units is lowered below supply range by adding for each circuit stage one or two generic device networks, wherein each generic device network establishes a voltage drop between the circuit and an associated supply rail, wherein the signal swings between a positive reference voltage, provided by the voltage drop in regard of the positive supply rail, and a negative reference voltage, provided by the voltage drop in regard of the negative supply rail, and wherein each of the voltage drops is constant and is independent of a current flowing through the generic device networks.

5. The method of claim 4, further comprising decoupling the signal range from biasing voltages by providing a DC biasing network comprising biasing voltage sources providing biasing voltages as required and corresponding resistors providing impedances required.

6. The method of claim 4, further comprising providing AC signal coupling of active devices of the circuit by a capacitive network.

7. The method of claim 1, wherein each unit of the circuit comprises a generic device Pull-Down network (PD) and a generic device Pull-Up network (PU), wherein a Pull-Up network (PU) network is a combination of devices able to tie the output of a unit to an upper reference voltage of the unit and a Pull-Down network (PD) network is a combination of devices able to tie the output of a unit to a lower reference voltage of the unit.

8. The method of claim 1, wherein input signals for the units have an arbitrary relationship enabled by placing a storage unit at a junction of two neighboring units.

9. The method of claim 8, wherein the storage unit is a capacitor.

10. The method of claim 8, wherein the input signals are the In-phase and Quadrature components of a signal.

11. The method of claim 1, wherein a stack of a number of vertically stacked units, forming a first stage, is connected to one or more next stages, each stage comprising also a number of vertically stacked units.

12. The method of claim 11, wherein the number of units in each stage may be equal, higher or lower than the number of units of the first stage.

13. A switching circuit configured to charge sharing/reuse of capacitive loads configured to lower signal range, comprising:
   two or more switching circuit units stacked upon each other wherein each unit comprises:
      two ports for input signals wherein each port is associated to a transistor,
      two transistors, wherein each transistor has a gate connected to the associated port; and
      an output capacitive means to store a charge depending upon a level of the input signals;
   wherein the units are stacked in a way that, if an output potential of an unit is to be lowered the charge flowing out of the output node of this unit is either used right away to lift the output node of a lower unit, or flows into a storage element for subsequent use, depending on input signals of the units.

14. The switching circuit of claim 13 wherein the circuit is a CMOS circuit.

15. The switching circuit of claim 13, wherein the circuit is a base of a full family of combinational and sequential logic circuits.

16. The switching circuit of claim 13, wherein the input signals are differential signals.

17. The switching circuit of claim 13, wherein the storage element is a capacitor.

18. The switching circuit of claim 13, wherein signal range of the units is lowered below supply range by
   one or two generic device networks implemented for each stage of the circuit adapted each to providing a positive and/or a negative reference voltage for each stage of the circuit while the reference voltages allow a signal range of each stage of the circuit below the supply range of the circuit, wherein the reference voltages are constant and independent of currents flowing through the one or two generic device networks of each stage;
   a DC biasing network biasing active devices of the circuit comprising biasing voltage sources providing biasing voltages as required and resistors providing impedances for biasing as required; and
   an AC coupling network of capacitive means to couple AC signals of a stage to a neighboring stage;
   wherein the DC biasing network and the AC coupling network are enabled to allow a signal range which may be lower than threshold voltages of the active devices of the circuit.

19. The switching circuit of claim 13, wherein a stack of a number of vertically stacked units, forming a first stage, is connected to one or more next stages, each stage comprising also a number of vertically stacked units.

20. The switching circuit of claim 19, wherein the number of units in each stage is equal, higher or lower than the number of units of the first stage.

* * * * *